United States Patent [19]
Iida

[11] Patent Number: 6,052,074
[45] Date of Patent: Apr. 18, 2000

[54] MULTI-CHANNEL DIGITAL-TO-ANALOG CONVERTERS COMPRISING WITH A PLURALITY OF CONVERTER UNITS

[75] Inventor: Jun Iida, Kanagawa, Japan

[73] Assignee: Rohm Co., Ltd., Kyoto, Japan

[21] Appl. No.: 09/102,526

[22] Filed: Jun. 22, 1998

[30] Foreign Application Priority Data

Oct. 22, 1997 [JP] Japan .................................. 9-307851

[51] Int. Cl.[7] .................................................. H03M 1/00
[52] U.S. Cl. .......................................... 341/135; 341/144
[58] Field of Search .................................... 341/144, 145, 341/136, 135, 143

[56] References Cited

U.S. PATENT DOCUMENTS

| | | | |
|---|---|---|---|
| 4,137,525 | 1/1979 | Tyrrel | 341/156 |
| 5,017,919 | 5/1991 | Hull et al. | 341/136 |
| 5,870,044 | 2/1999 | Dell'ova et al. | 341/120 |
| 5,870,049 | 2/1999 | Huang et al. | 341/144 |

*Primary Examiner*—Brian Young
*Assistant Examiner*—Peauy Jean Pierre
*Attorney, Agent, or Firm*—Majestic, Parsons, Siebert & Hsue P.C.

[57] ABSTRACT

A multi-channel D/A converter is formed with a plurality of converter units, each having one single input transistor and a plurality of output transistors which together form current mirrors. Mutually corresponding ones of these output transistors of different ones of the converter units, which are switched on and off together, are disposed adjacently and connected together to a trunk power supply line such that the parasitic resistances through the conductive lines connected to the output transistors are alike and the conversion characteristics of the individual converter units also become alike. One common input transistor may be shared by all of the converter units for further improving the conversion characteristic.

19 Claims, 4 Drawing Sheets

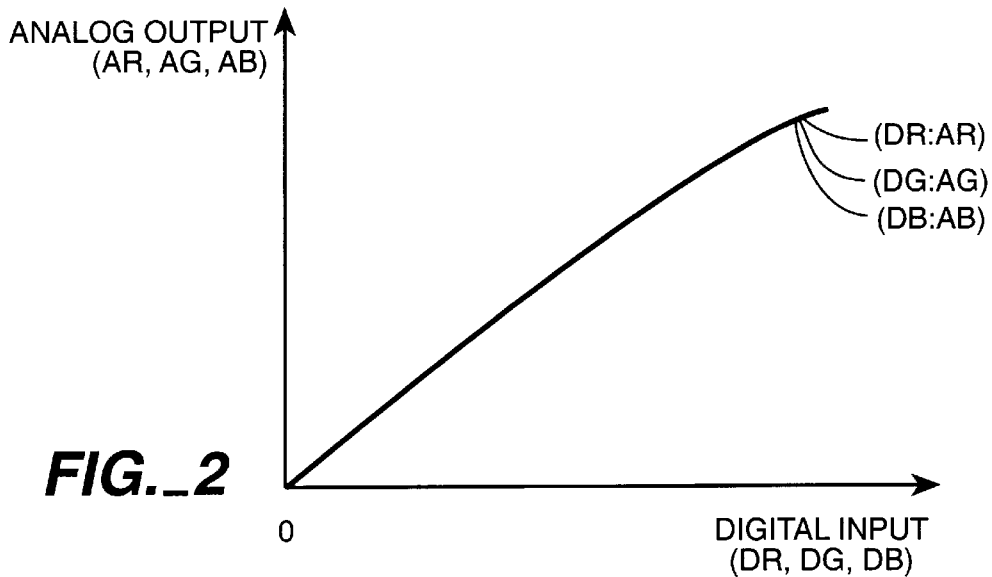
FIG._2
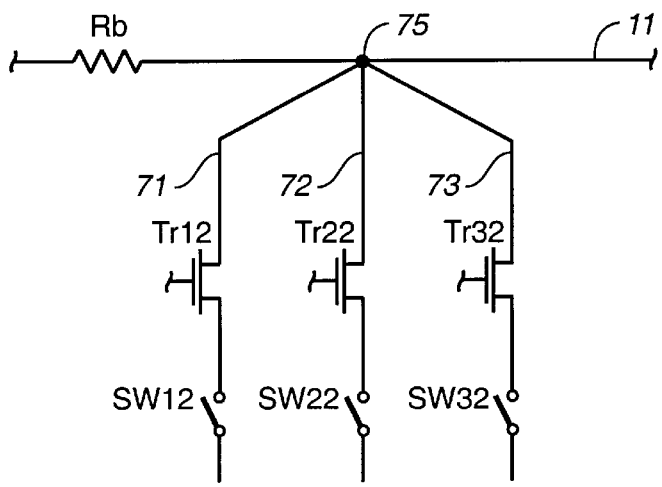
FIG._3
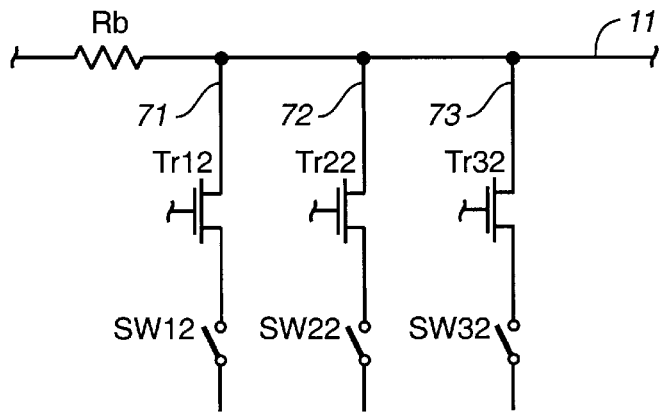
FIG._4

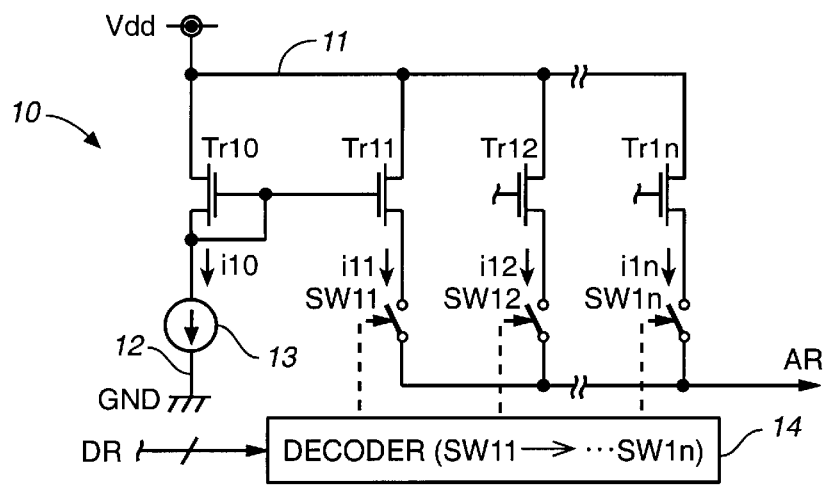
FIG._5A
*(PRIOR ART)*
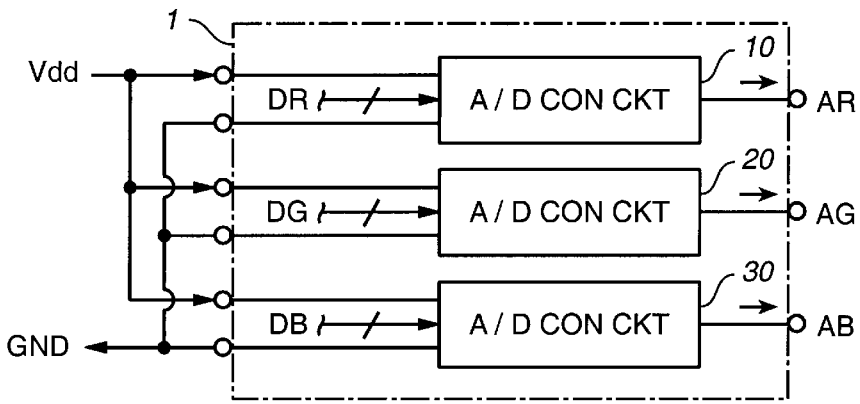
FIG._5B
*(PRIOR ART)*
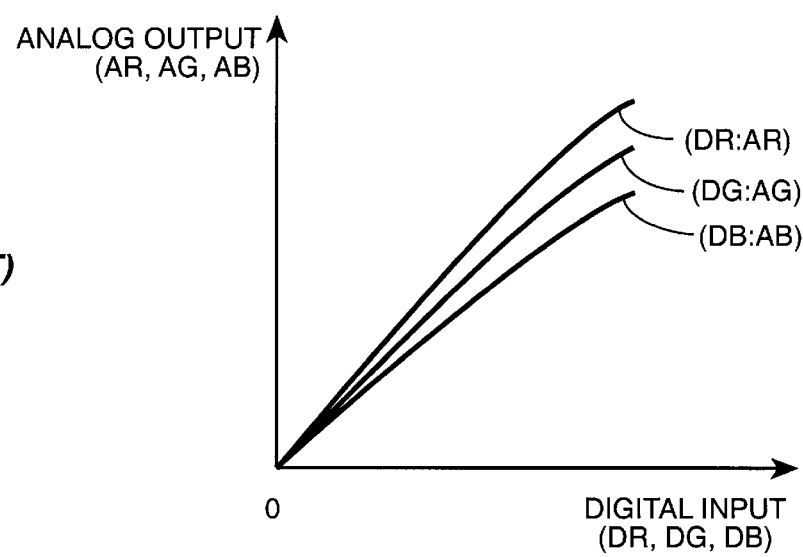
FIG._7
*(PRIOR ART)*

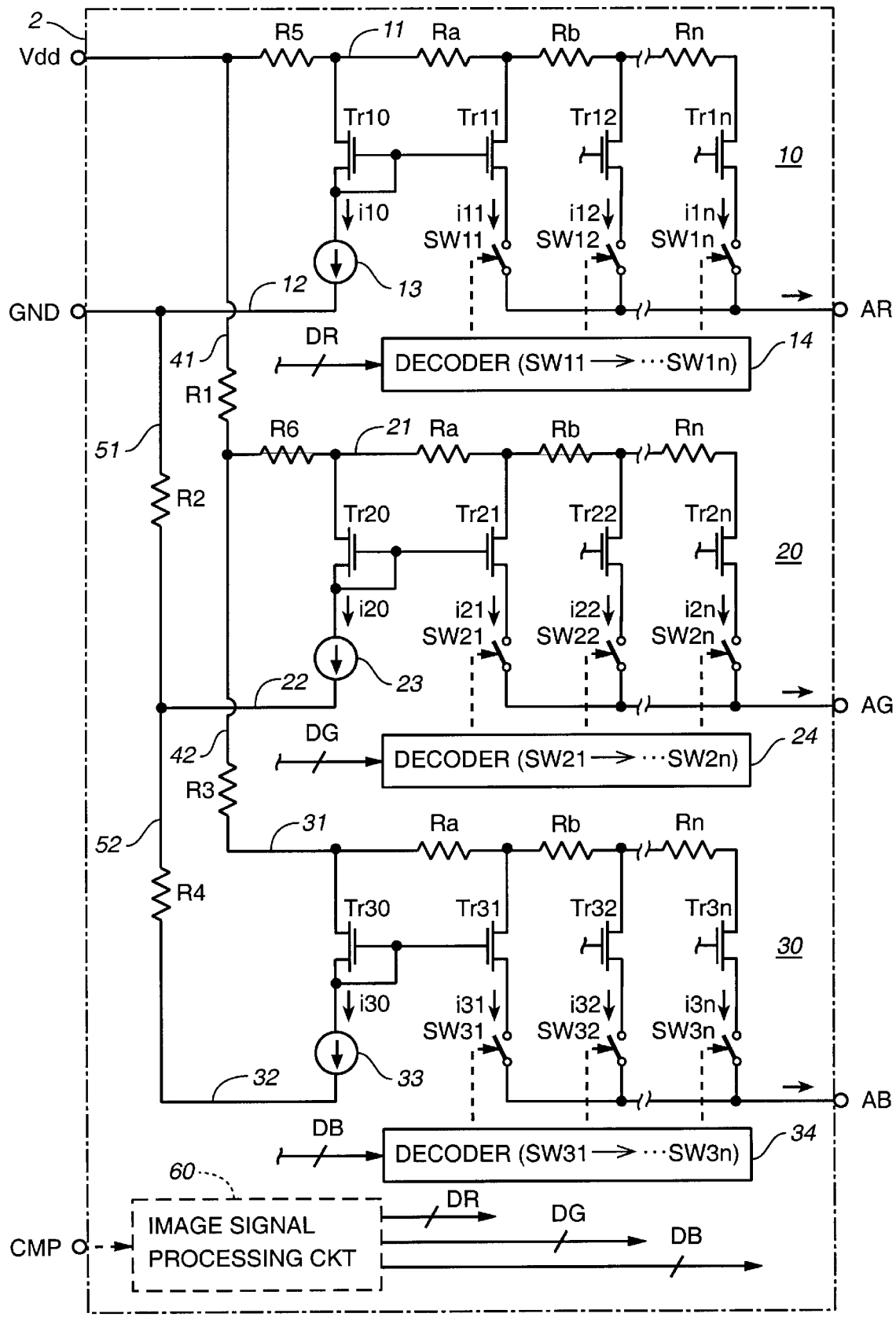
FIG._6 *(PRIOR ART)*

6,052,074

MULTI-CHANNEL DIGITAL-TO-ANALOG CONVERTERS COMPRISING WITH A PLURALITY OF CONVERTER UNITS

BACKGROUND OF THE INVENTION

This invention relates to multi-channel digital-to-analog (D/A) converters comprising a plurality of D/A converter units of the current cell type. More in detail, this invention relates to such multi-channel D/A converters structured by taking into consideration the variations in the conversion characteristics of the individual D/A converter units. In order to uniformize the conversion characteristics of the individual D/A converter units, undesirable ill-effects of parasitic resistances in the conductive lines to each of the D/A converter units are eliminated.

FIG. 5A shows an example of prior art D/A converter unit 10 of the current cell type, representing a basic D/A converter unit for one-channel operation for converting one digital input DR into one analog output AR, comprising a plural n-number (determined by $2^m$) of current mirrors where m is the number of bits of the digital input DR. Explained more in detail, this converter unit 10 comprises n pairs of transistors Tr10+Tr11, Tr10+Tr12, ..., Tr10+Tr1n forming current mirrors and a decoder 14 (or a selecting means) for decoding the digital input DR and outputting selection signals to the individual current mirrors. The total current outputted from those of the transistors Tr11–Tr1n which were selected by the selection signals serves as the analog output AR. In other words, a plurality of current mirrors and the currents outputted therefrom are selectively reflected in the analog output AR, and this is how the analog output AR is generated, corresponding to the digital input DR.

Explained further in detail, the transistor Tr10 is a MOS transistor on the input side of the current mirrors, its drain being connected to a source line 11, its source being connected to a steady current source 13 for a reference current i10, and its gate being connected to the gate of each of the other transistors Tr11–Tr1n. Thus, the transistor Tr10 may be referred to as the input transistor, serving to output a steady reference current.

The transistor Tr11 is another MOS transistor on the output side of one of the current mirrors, its drain being connected to the source line 11 and its source, through which a mirror current i11 flows, being connected through a switch SW11 to an output line for outputting the analog output AR. Each of the other transistors Tr12–Tr1n is similarly a MOS transistor serving as the output transistor of a corresponding one of the current mirrors, its drain being connected to the source line 11 and its source, through which a mirror current i12, i13, ..., or i1n flows, being connected through a switch SW12, SW13, ..., or SW1n to the output line. In summary, the transistors Tr11–Tr1n are a plurality of output transistors having a single input transistor Tr10 to together form n current mirrors which are partially in common. Depending on whether the individual switches SW11–SW1n are closed (ON) or open (OFF), the output currents i11–i1n from these current mirrors may or may not be included in the analog output AR. It is the decoder 14 that controls the opening and closing of these switches, causing a proper number of switches to be opened, depending on the digital input DR. As the value of the digital input DR increases sequentially from "0" to "1", "2", ... and "n", the decoder 14 normally switches on (closes) the switches SW11, ... and SW1n in a specified order. As the value of the digital input AD is reduced sequentially, the switches are opened also sequentially in the reverse order.

A multi-channel D/A converter requires not only one but a plurality of such D/A converter units. When a color image has been subjected to a digital signal processing according to the three basic colors RGB, for example, a three-channel D/A converter is used for generating an analog output and transmitting to a monitor or the like.

FIG. 5B shows an integrated circuit (IC) 1 providing such a multi-channel D/A converter having three D/A converter units as described above for three channels integrated on one chip. In this example, the multi-channel D/A converter 1 is shown as having a cell-type D/A converter unit as described above and illustrated at 10 in FIG. 5A, another similarly structured D/A converter unit 20 adapted to convert a digital input DG into an analog output AG and still another similarly structured D/A converter unit 30 adapted to convert a digital input DB into an analog output AB. Let us assume that each of these digital inputs DR, DG and DB assumes 6 bits and n=63.

Such a multi-channel D/A converter 1 requires three power terminals for supplying source voltage Vdd and three grounding terminals GND are required in addition to the output terminals for the analog outputs AR, AG and AB. When the multi-channel D/A converter 1 thus structured is mounted to a printed circuit board, for example, the three power terminal and the three grounding terminals are usually connected individually together through wiring outside the multi-channel D/A converter 1. Because of the large number of terminals, the IC package cannot be sufficiently miniaturized and the printed wiring becomes undesirably complicated.

In view of the above, it may be proposed to connect conductive lines such as power source lines and reference voltage lines connecting between the individual converter units within the multi-channel D/A converter such that one power source terminal for the source voltage Vdd and one grounding terminal can be shared among the three D/A converter units. FIG. 6 shows another integrated circuit 2 of a multi-channel D/A converter thus structured, indicating corresponding components by the same numerals as in FIG. 5B. In FIG. 6, the components of the converter units 20 and 30 that correspond to those of the converter unit 10 are each indicated by a symbol obtained by adding respectively 10 or 20 to that of the corresponding component of the converter unit 10. In FIG. 6, numeral 60 indicates an image signal processing circuit, as an example of circuit which may be also integrated, for generating the digital input DR, DG and DB to be transmitted to the individual converter units 10, 20 and 30 from a received composite image signal CMP.

Explained more in detail, trunk power source lines for the individual (first, second and third) converter units 10, 20 and 30 are respectively indicated by numerals 11, 21 and 31, and grounding lines for the three converter units 10, 20 an 30 are respectively indicated by numerals 12, 22 and 32. The trunk power source line 21 for the second converter unit 20 is connected to the trunk power source line 11 to the first converter unit 10 through a branch power source line 41, but the trunk power source line 31 for the third converter unit 30 is connected not to the trunk power source line 11 to the first converter unit 10 but to the aforementioned branch power source line 41 to the second converter unit 20 through another branch power source line 42. Similarly, the grounding line 11 of the first converter unit 10 is directly connected to the grounding terminal GND but the grounding line 22 of the second converter unit 20 is connected not directly to the grounding terminal but through a connecting line 51 to the grounding line 12 of the first converter unit 10, and the grounding line 32 of the third converter unit 30 is connected through another connecting line 53 to the grounding line 22 of the second converter unit 20.

Thus, parasitic resistances Ra–Rn to the trunk power source lines 11, 21 and 31 through which relatively large currents flow, as well as parasitic resistances R1, R2, R3 and R4 to the branch power source lines and to the connecting lines through which, too, fairly large currents flow, affect the conversion characteristics of the converter units 10, 20 and 30 adversely. These adverse effects usually appear in the form of lowered analog outputs, especially from converter units of the later stages (positioned farther away from the power source terminal where the source voltage Vdd is applied) containing more parasitic resistances. This is schematically illustrated by the input-output characteristic diagram of FIG. 7 showing that the characteristic curve for the second converter unit 20 is lower than that of the first converter unit 10 and that the characteristic curve of the third converter unit 30 is even lower than that of the second converter unit 20, the difference being greater for larger values of digital input.

Since such differences in the conversion characteristics among the converter units cause irregularities in the color display and adversely affect the overall color quality of the displayed image, appropriate adjustment resistors R5 and R6 are inserted respectively on the trunk power source lines 11 and 21 to the first and second converter units 10 and 20 on the side towards the power source terminal. After the multi-channel D/A converter has been produced, its conversion characteristics are measured, and these adjustment resistors R5 and R6 are adjusted, say, by trimming, according to the result of the measurement such that the variations among the conversion characteristics of the converter units 10, 20 and 30 are controlled.

This kind of attempt at multi-channel D/A conversion is not satisfactory because it is a cumbersome process to adjust these resistors for all converter units.

Although not separately illustrated, there has also been an attempt to use a single converter unit sequentially with a plurality of pairs of digital input and analog output. Neither is this method satisfactory because if the number of channels is large, the sampling rate must be increased accordingly in order to maintain the same processing efficiency because a single converter unit must be shared time-wise.

SUMMARY OF THE INVENTION

It is therefore an object of this invention to provide a multi-channel D/A converter with converter units for the individual channels having uniform conversion characteristics.

A multi-channel D/A converter embodying this invention, by which the above and other objects can be accomplished, may be characterized not only as comprising a plurality of converter units, each having one single input transistor and a plurality of output transistors which form current mirrors with this single input transistor, but also wherein mutually corresponding ones of these output transistors of different ones of the plurality of converter units are disposed adjacently together. In the characterization of the above, the "mutually corresponding" output transistors are not only disposed physically next to one another but connected together to the trunk power source supply line such that the parasitic resistances of conductive lines connecting to them are alike. If the digital inputs to the plurality of converter units each have the same number of bits, the current mirrors that are selected to be switched on and off as the value of the digital input increases or decreases may be connected in a one-to-one relationship. In the case of a two-channel converter with signals of one channel having 2 bits more than those of the other channel, for example, every four ($=2^2$) current mirrors for the first channel may be made to correspond to one current mirror for the second channel.

With a multi-channel D/A converter thus structured, the conversion characteristics of the individual converter units become similar because the parasitic resistances of the conductive lines connected to the output transistors selected at the same time are made alike and hence the output currents from them are also alike.

According to a preferred embodiment of the invention, the plurality of converter units share one common input transistor instead of each having its own separate input transistor. With a multi-channel D/A converter thus structured, there is no variation among the reference currents for the plurality of converter units and they match completely. As a result, ill-effects due to variations among the characteristics of the input transistors can be reduced and a multi-channel D/A converter with still better uniformized conversion characteristics among its conversion units can be realized. When such a multi-channel D/A converter is mounted to a printed circuit board, the IC and the circuits for the mounting can be made compact because the number of power supply terminals is reduced (that is, less than the number of the converter units) and the external wiring for the mounting can also be simplified.

BRIEF DESCRIPTION OF THE DRAWINGS

The accompanying drawings, which are incorporated in and form a part of this specification, illustrate embodiments of the invention and, together with the description, serve to explain the principles of the invention. In the drawings:

FIG. 2 is a conversion characteristic curve of the D/A converter of FIG. 1;

FIG. 3 is a circuit diagram of a portion of a multi-channel D/A converter according to a second embodiment of this invention, FIG. 4 is a circuit diagram of a portion of a multi-channel D/A converter according to a third embodiment of this invention;

FIG. 5A is a circuit diagram of a prior art cell type D/A converter unit and FIG. 5B is a block diagram of a integrated circuit formed by simply placing three of such prior art converter units in parallel;

FIG. 6 is a circuit diagram of another integrated circuit which may be obtained if the power source terminals of the three converter units of FIG. 5B are connected to a common terminal; and FIG. 7 is a conversion characteristic curve of the converter of FIG. 6.

Throughout herein, like or corresponding components are indicated by the same symbols even where they are components of different D/A converters and may not necessarily be explained repetitiously.

DETAILED DESCRIPTION OF THE INVENTION

Figure 1:
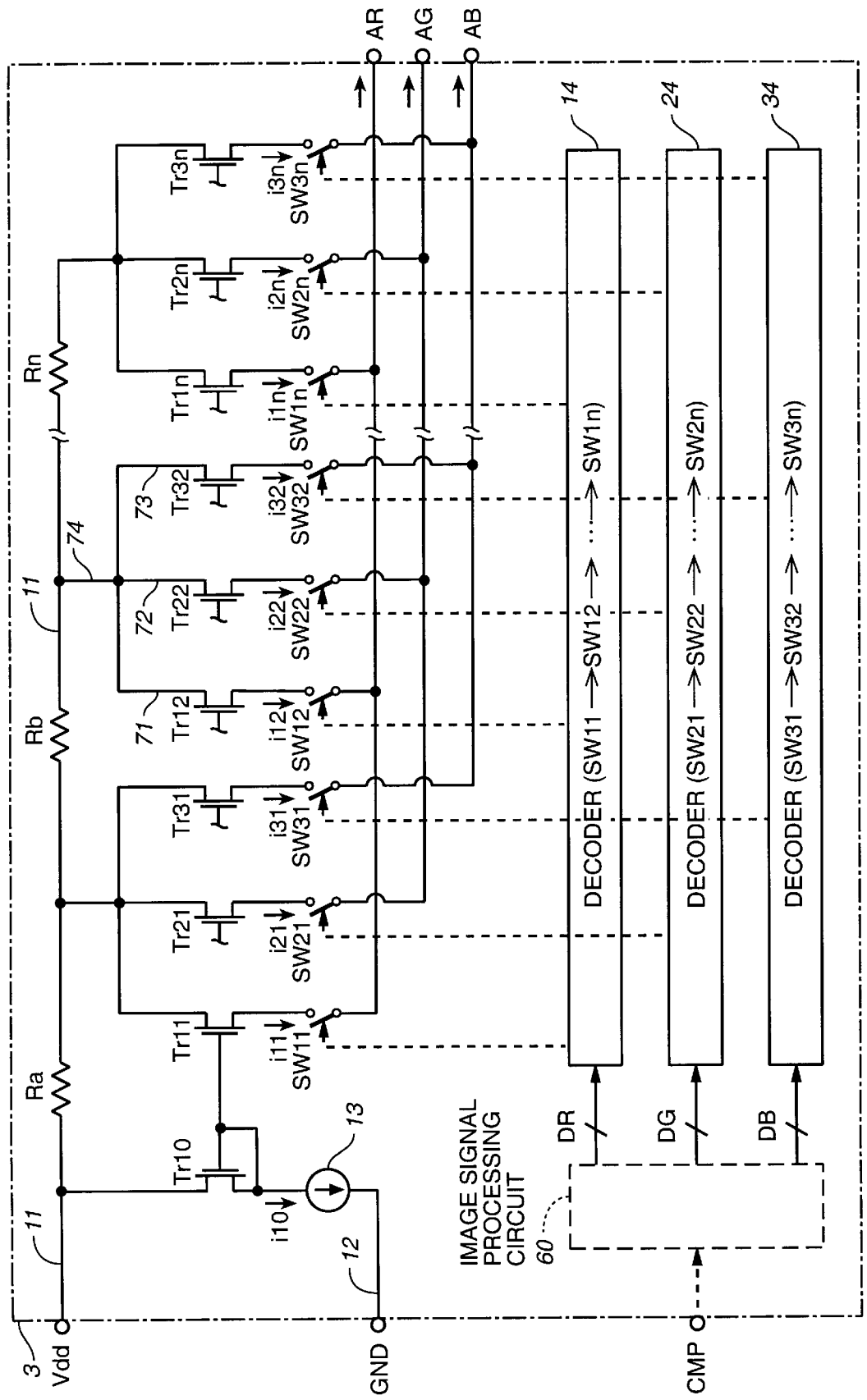
FIG. 1 is a circuit diagram of a multi-channel D/A converter according to a first embodiment of this invention.

FIG. 1 shows an integrated circuit of a multi-channel D/A converter 3 according to a first embodiment of this invention. Since this multi-channel D/A converter 3 is very similar to the prior art multi-channel D/A converter 2 described above with reference to FIG. 6, the same symbols will be used in FIG. 1 to indicate like or corresponding components and only the differences between them will be pointed out for convenience.

Firstly, FIG. 1 is different from FIG. 6 in that it is not only the transistors Tr11, Tr12, ..., Tr1n which are selectable by the first decoder 14 but also the transistors Tr21, Tr22, ..., Tr2n which are selectable by the second decoder 24 and the transistors Tr31, Tr32, ..., Tr3n which are selectable by the third decoder 34 that have their drains connected to the trunk power source line 11. Moreover, they are connected to the trunk power source line 11 in the order they are selected as the values of the digital inputs DR, DG and DB increase from "0" sequentially to "1", "2", ..., "n". Since the transistors Tr11, Tr21 and Tr31 are selected at the same time, although by different decoders 14, 24 and 34, they are connected together to the trunk power source line 11. Similarly, the transistors Tr12, Tr22 and Tr32, which are selected next together, are connected together to the trunk power source line 11 at a point on the downstream side (away from the power source terminal) of the junction to the transistors Tr11, Tr21 and Tr31. In other words, those of the output transistors of the current mirrors of different converter units (indicated by 10, 20 and 30 in FIG. 6) which are selected at the same time (in response to corresponding digital inputs) are placed together as a group adjacent one another. The other trunk power source lines 21 and 31 and the branch power source lines 41 and 42 extend thereto, which were present in FIG. 6, are absent in the multi-channel D/A converter 3 of FIG. 1. As a result, the parasitic resistances R1 and R3, as well as adjustment resistors R5 and R5, which were present in FIG. 6 are also absent in FIG. 1.

Secondly, FIG. 1 is different from FIG. 6 in that the transistors Tr11, Tr21 and Tr31 of the multi-channel D/A converter 3, which are selected at the same time respectively by the decoders 14, 24 and 34 as the value of the digital inputs DR, DG and DB increases from "1" to "2", are all connected first to a common connecting line 74 through their individual connecting lines 71, 72 and 73 and then to the trunk power source line 11 through this common connecting line 74. The other groups of simultaneously selected transistors Tr11+Tr21+Tr31, Tr13+Tr23+Tr33, ..., Tr1n+Tr2n+Tr3n are similarly connected to the trunk power source line 11. In this manner, the transistors in each group to be selected at the same time are equally closely (directly) connected to the trunk power source line 11.

Thirdly, FIG. 1 is different from FIG. 6 in that the gates of not only the transistors Tr11–Tr1n which are selected by the first decoder 14 but also the gates of the transistors Tr21–Tr2n which are selected by the second decoder 24 and those of the transistors Tr31–Tr3n which are selected by the third decoder 34 are connected to the gate of the input transistor Tr10 such that all output transistors of the three groups of n current mirrors corresponding to the digital inputs DR, DG and DB have the same transistor Tr10 as the input transistor. In other words, the plurality of converter units (of FIG. 6) controlled by the plurality of decoders 14, 24 and 34 use a single input transistor in common. As a result, the other input transistors Tr20 and Tr30, the grounding lines 22, 32, 51 and 52 and their parasitic resistances R2 and R4 which were present in FIG. 6 are absent in FIG. 1. Moreover, FIG. 1 is different from FIG. 6 in that there is only one power supply terminal for applying source voltage Vdd and only one grounding terminal GND.

The conversion characteristic of the multi-channel D/A converter 3 shown in FIG. 1 is shown in FIG. 2. This is to be contrasted to the curves shown in FIG. 7. It is to be noted that the three input-output characteristics DR-AR, DG-AG and DB-AB are substantially the same in FIG. 2.

The advantages of the converter 3 over the prior art converter 2 are many. Firstly, since the converter 3 does not have any adjustment resistors (such as R5 and R6 shown in FIG. 6), there is no trimming to be carried out after testing and hence the packaging of products can be completed more swiftly. When it is mounted to a printed circuit board, for example, there are fewer holes to be drilled for inserting pins. Moreover, there is no need to join together a plurality of source power terminals or grounding terminals and hence complicated wiring as shown in FIG. 5B is not needed. Thus, it becomes easier to design and produce the printed circuit board and the board can be made more compact.

When the multi-channel D/A converter 3 is activated and the image signal processing circuit 60 generates digital inputs DR, DG and DB, an analog output AR corresponding to the digital input DR is generated by the n pairs of transistors Tr10+Tr11, Tr10+Tr12, ..., Tr10+Tr1n (corresponding to the first converter unit 10 of FIG. 5B) and the first decoder 14, an analog output AG corresponding to the digital input DG is generated by the n pairs of transistors Tr10+Tr21, Tr10+Tr22, ..., Tr10+Tr2n (corresponding to the second converter unit 20 of FIG. 5B) and the second decoder 24, and an analog output AB corresponding to the digital input DB is generated by the n pairs of transistors Tr10+Tr31, Tr10+Tr32, ..., Tr10+Tr3n (corresponding to the third converter unit 30 of FIG. 5B) and the third decoder 34. In other words, there is only one reference current i10 flowing through one input transistor which is common to and shared by all of the current mirrors of all channels. As a result, there are no differences in the conversion characteristics among the converter units which would occur in prior art multi-channel D/A converters such as shown in FIG. 5B or 6 due to the variations among the reference currents for the individual converter units 10, 20 and 30. Moreover, since there are no parasitic resistances R1–R4, there do not arise any differences among the conversion characteristics of the individual converter units due to differences in such parasitic resistances.

Furthermore, those of the transistors which are switched on and off together (such as Tr12, Tr22 and Tr32) share not only the parasitic resistances (such as Ra and Rb) in the trunk power source line 11 but also the common connecting line 74. The only difference would be with reference to their individual connecting lines 71, 72 and 73 but they are short lines and hence the differences in the resistance parasitic to these lines are negligibly small. As a result, their output currents i12, i22 and i32 are practically the same. The same is true also for the other groups of output currents i11, i21 and i31, ..., i1n, i2n and i3n. Thus, as explained above, the characteristic curves for the analog outputs AR, AG and AB (respectively against the digital inputs DR, DG and DB) overlap practically completely, as shown in FIG. 2.

Many modifications and variations are possible within the scope of this invention. FIG. 3 shows a second embodiment of this invention which is similar to the first embodiment of the invention described above except transistors which are switched on and off together (such as Tr12, Tr22 and Tr32) are directly and individually connected through their individual connecting lines 71, 72 and 73 to a single connecting point 75 on the trunk power source line 11, without first joining a common connecting line (as shown at 74 in FIG. 1).

FIG. 4 shows a third embodiment of this invention which is similar to the first and second embodiments of the invention described above except transistors which are switched on and off together (such as Tr12, Tr22 and Tr32) are directly and individually connected through their individual connecting lines 71, 72 and 73 to different but mutually near-by points on the trunk power source line 11. This mode of connection is convenient, for example, where the trunk power source line 11 is bent and it is difficult to make a direct connection.

In summary, a multi-channel D/A converter according to this invention has superior conversion characteristics because the effects of parasitic resistances are either eliminated by using a single transistor on the input side of all of the transistors on the output side of current mirrors or reduced by arranging conductive lines from the trunk power source line to the individual transistors.

What is claimed is:

1. A multi-channel D/A converter comprising:

a plural number of converter units, said plural number of input lines through which digital signals are individually inputted to said converter units each of said input lines being associated with a different one of said converter units, and said plural number of output lines through which analog signals are individually outputted from said converter units, each of said output lines being associated with a different one of said converter units, each of said plural number of converter units including one single input transistor and said plural number of output transistors which form said plural number of current mirrors with said single input transistor, mutually corresponding ones of said output transistors of different ones of said plurality of converter units being disposed adjacently together.

2. The multi-channel D/A converter of claim 1 further comprising decoders, each associated with a different one of said converter units and serving to sequentially select said output transistors of said associated converter unit.

3. The multi-channel D/A converter of claim 2 wherein said mutually corresponding output transistors are switched on and off simultaneously by said decoders.

4. The multi-channel D/A converter of claim 3 wherein said mutually corresponding output transistors have conductive connecting lines which are connected together.

5. The multi-channel D/A converter of claim 4 wherein said conductive connecting lines are connected together to a power supply line connected to a power supply source where a source voltage is applied.

6. The multi-channel D/A converter of claim 5 wherein said plural number of converter units share one common input transistor which serves as said one single input transistor of each of said converter units.

7. The multi-channel D/A converter of claim 2 wherein said plural number of converter units share one common input transistor which serves as said one single input transistor of each of said converter units.

8. The multi-channel D/A converter of claim 2 wherein each of said output transistors is connected to an associated one of said output lines through a switch which is operated by a corresponding one of said decoders.

9. The multi-channel D/A converter of claim 3 wherein said plural number of converter units share one common input transistor which serves as said one single input transistor of each of said converter units.

10. The multi-channel D/A converter of claim 4 wherein said plural number of converter units share one common input transistor which serves as said one single input transistor of each of said converter units.

11. The multi-channel D/A converter of claim 1 wherein said mutually corresponding output transistors have conductive connecting lines which are connected together.

12. The multi-channel D/A converter of claim 11 wherein said conductive connecting lines are connected together to a power supply line connected to a power supply source where a source voltage is applied.

13. The multi-channel D/A converter of claim 11 wherein said plural number of converter units share one common input transistor which serves as said one single input transistor of each of said converter units.

14. The multi-channel D/A converter of claim 12 wherein said plural number of converter units share one common input transistor which serves as said one single input transistor of each of said converter units.

15. The multi-channel D/A converter of claim 1 wherein said plural number of converter units share one common input transistor which serves as said one single input transistor of each of said converter units.

16. The multi-channel D/A converter of claim 1 further comprising a signal processor which serves to receive a digital signal and to generate therefrom individual digital inputs which are transmitted to said plural number of converter units through said input lines.

17. The multi-channel D/A converter of claim 1 wherein said plurality of converter units are similarly structured.

18. The multi-channel D/A converter of claim 1 further comprising a constant current source which operates said single input transistor.

19. The multi-channel D/A converter of claim 1 wherein each of said output transistors is connected to an associated one of said output lines through a switch.

* * * * *